United States Patent [19]

Conru et al.

[11] Patent Number: 4,907,734
[45] Date of Patent: Mar. 13, 1990

[54] METHOD OF BONDING GOLD OR GOLD ALLOY WIRE TO LEAD TIN SOLDER

[75] Inventors: H. Ward Conru, Essex Junction, Vt.; Stephen E. Gons, Camp Hill, Pa.; Gordon C. Osborne, Jr.; Douglas W. Phelps, Jr., both of Burlington, Vt.; Stephen G. Starr, Essex Junction; William C. Ward, Burlington, both of Vt.

[73] Assignee: International Business Machines Corporation, Armonk, N.Y.

[21] Appl. No.: 263,806

[22] Filed: Oct. 28, 1988

[51] Int. Cl.⁴ .............................................. B23K 20/00
[52] U.S. Cl. .................................. 228/123; 228/110; 228/179
[58] Field of Search ........... 228/110, 123, 179, 263.12, 228/1.1, 4.5

[56] References Cited

U.S. PATENT DOCUMENTS

| | | | |
|---|---|---|---|
| 2,894,862 | 7/1959 | Mueller | 228/123 |
| 3,672,047 | 6/1972 | Sakamoto et al. | 228/123 |
| 3,733,685 | 5/1973 | Kauppila | 228/179 |
| 3,750,926 | 8/1973 | Sakamoto et al. | 228/179 |
| 4,739,917 | 4/1988 | Baker | 228/226 |

Primary Examiner—Richard K. Seidel
Assistant Examiner—Samuel M. Heinrich

[57] ABSTRACT

A compression bond is formed between a gold or gold alloy wire and lead/tin solder by forming a head on the wire and forcing the head into a pad of the solder by thermosonic, or thermocompression, or ultrasonic compression bonding techniques. This forms a gold/tin intermetallic compound which in turn forms the bond. The head of the wire is maintained out of contact with any underlying surface, and surrounded by the solder.

12 Claims, 1 Drawing Sheet

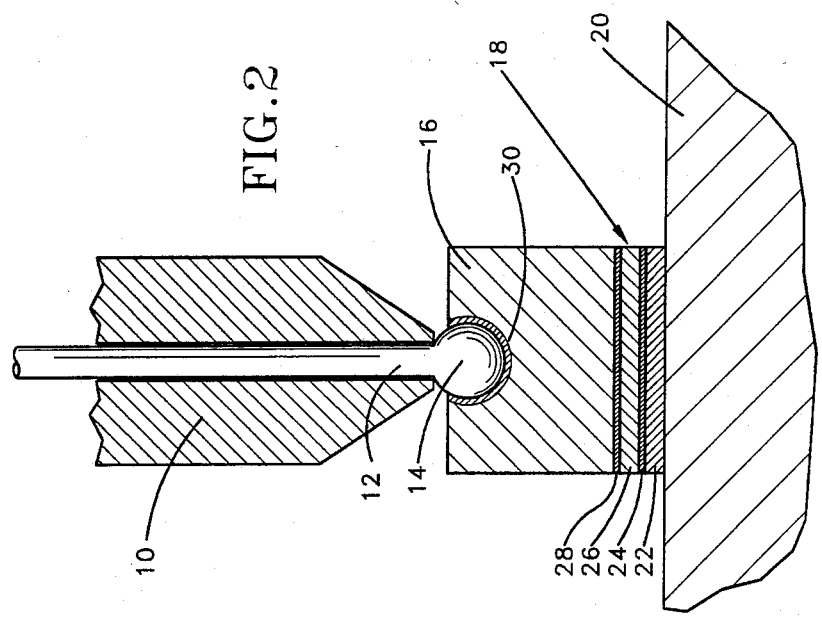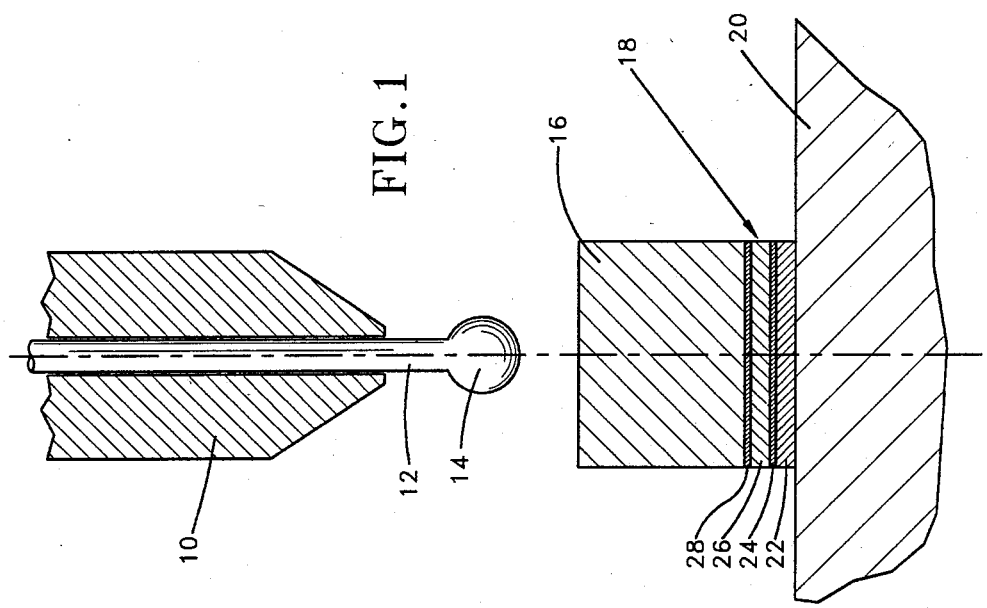

METHOD OF BONDING GOLD OR GOLD ALLOY WIRE TO LEAD TIN SOLDER

BACKGROUND OF THE INVENTION

1. Field of the Invention

The present invention relates generally to the bonding of gold or gold alloy wire to lead/tin solder pads. In more particular aspects, the invention relates to the compression bonding, either by thermocompression or thermosonic or ultrasonic bond of gold and gold alloy wires to lead/tin solder pads, and finds particular application in bonding wires to pads on semi-conductor chips.

2. Prior Art

In the production of semi-conductor chips, it is frequently necessary to bond various types of wire to attachment pads formed on the semi-conductor chips. The compositions of the pads as well as the wires and the techniques for bonding the wires to such pads have taken many different forms in the past. In some prior art configurations, the semi-conductor chips have been provided with aluminum or aluminum alloy pads to which wires must be bonded. Often gold wires were utilized and bonded to the pads by thermocompression bonding. An example of this type of bonding is disclosed in U.S. Pat. No. 3,091,849. In this particular patent, gold wires are thermocompression bonded to silicon surfaces of the underlying semi-conductor chip. Other methods of bonding have included solder bonding wherein the solder (such as lead tin solder) is used and melted to form a bond often to other pads also containing solder. This type of bonding is shown in U.S. Pat. No. 3,665,590.

It has also been found that it is not possible to obtain a good bond by normal reflow techniques between gold wire and lead/tin solder since the reflow of the lead/tin solder will dissolve the gold and not form a bond between the gold and the solder.

SUMMARY OF THE INVENTION

According to the present invention, it has been found that a good bond can be obtained between gold or an alloy of gold which contains at least 50% gold content and a lead/tin solder by compression bonding techniques under carefully controlled conditions and parameters. In these techniques, a pad of lead/tin solder is placed over the substrate. The end of a wire is formed into a gold or a gold alloy ball, which contains at least 50% gold, and is then inserted by compression techniques such as thermosonic, thermocompression, or ultrasonic techniques into the solder pad. The pad is sufficiently thick so that it will receive the end of the wire and the wire is thrust in such a distance that it does not penetrate through the pad to touch the substrate, but rather is spaced therefrom and therefore is surrounded by the lead tin solder. The compression bonding technique results in a very thin layer of a gold-tin intermetallic compound which provides the bond between the wire and the solder. Thus, the wire must not be inserted so far that it comes in contact with the base material, but must be inserted sufficiently to allow this intermetallic layer to form therearound.

The compression bonding can be thermosonic compression bonding, thermocompression bonding, or ultrasonic compression bonding. Further, it is contemplated that following the compression bonding a baking or heating step can be applied which will in certain instances, increase the thickness of the intermetallic compound, thereby improving the strength of the bond. However, the need for the heating step depends upon the temperature at which the compression bonding was performed, as well as the required strength of the bond.

DESCRIPTION OF THE DRAWING

FIG. 1 is a side elevational view, somewhat diagrammatic, of a gold wire ready to be compression bonded onto a lead/tin solder pad on top of Al/Cr/Cu/Au pedestal; and FIG. 2 is a view similar to FIG. 1 showing the compression bond effected between the gold wire and the lead/tin solder pad.

DESCRIPTION OF THE PREFERRED EMBODIMENTS

Referring now to the drawing and for the present, FIG. 1, a gold wire ready for compression bonding onto a lead tin solder pad is shown somewhat diagrammatically. Compression bonding techniques as well as machines for compression bonding are well known in the art and no detailed description thereof is needed herein. For example, UK patent No. GB 2137914A filed Mar. 29, 1983 and published Oct. 17, 1984 describes and shows a typical device and technique for compression bonding. In this technique, a capillary is provided through which a wire extends and means such as a flame are provided to heat the end of the wire and provide a ball. When the ball has been formed, the machine plunges the wire against the substrate to which it is to be bonded. This can be done either in conjunction with heating of the substrate or the application of ultrasonic energy or both.

As shown in FIG. 1, a capillary 10 is provided through which a wire 12 is extended. The end of the wire 12 has been heated and fused to form a ball 14 in a conventional manner and the ball allowed to solidify. The wire 12 is to be bonded to a lead/tin solder material 16 which is deposited onto a pedestal 18 which conventionally is a pad formed on a semi-conductor chip 20. The composition and structure of the pedestal 18 may vary, but preferably it is a pad formed of an aluminum base 22, a layer of Chromium 24, a layer of Copper 26 and a cap of Gold 28. This is a conventional type of pedestal used in flip-chip bonding. The thickness of aluminum and Copper layers typically will be about 1 micron and of the Chromium and Gold about 0.1 micron. Although the thickness of the solder material 16 may vary, conventionally this can be about 3 mils in this configuration. The only requirement is that the material 16 be thick enough such that when the bonding is effected as shown in FIG. 2, there will be solder material between the end of the ball 14 and the pedestal material 18.

As shown in FIG. 2, the compression bonding is effected by plunging the ball 14 of the wire 12 into the solder material 16 which preferably is a lead/tin solder having a nominal composition of about 95% lead and 5% tin. If desired, the substrate and/or the wire can be heated, the heating preferably being between 95 degrees Centigrade and 180 degrees Centigrade. In any event, the heating must be to a temperature below the lowest melting eutectic of the lead/tin alloy which in the case of a lead/tin solder is 183 degrees Centigrade. Also, if desired, ultrasonic energy can be applied either in conjunction with the heating of the substrate or may be done independently thereof.

An analysis of the bond formed using Energy Dispersive Spectroscopy (EDS) and Wavelength Dispersive Spectroscopy (WDS) on a J.E.O.L., JX1-8400 Analytical Electronic Microscope, using back scatter electron (BSE) imaging was performed to determine the composition of the interface region. From these tests, it was determined that there was a gold/tin intermetallic compound formed at the interface between the gold ball 14 and the solder 16 as shown at 30. It is believed that this gold/tin intermetallic compound is what forms the bond between the solder and the gold and it has been determined that a relatively strong structural bond is indeed formed and will provide a good and acceptable interconnection between the gold wire 12 and the solder material 16. However, it is absolutely necessary that the distance of penetration of the ball 14 into the solder stop short of the pedestal 18 in order to allow this intermetallic compound to be formed in a substantial region around the ball to provide the bond. If the gold ball 14 breaks through the solder material 16 and comes into contact with the pedestal 18, such intermetallic compound is not formed and hence, the required bonding is not produced. Further, it has been found that if at any time during the bonding or thereafter, the solder is heated to above the melting point of its lowest melting eutectic, i.e., in this case, 183 degrees Centigrade, the gold will dissolve into the solder and will not form this intermetallic compound and a satisfactory bond is not achieved. Thus, it is essential that at all times, the operation be carried out at a temperature below that of the melting point of the lowest melting point eutectic of the solder material 16.

This technique can also be used on any application wherein there is sufficient thickness of the solder, irrespective of the composition of the pedestal or substrate on which the solder is applied.

It has also been found that in some cases the bond strength can be somewhat increased by heating the resulting structure to a temperature between 95 degrees centigrade and 180 degrees centigrade which will cause a thickening of the intermetallic compound layer 30 and thus, may improve the bond strength to some degree. However, in many cases, depending on the conditions of the bonding and the desired resulting strength of the bond, this subsequent heating step may be omitted as it may only be marginally effective.

It has also been found that this technique works not only on pure gold wire but also works on gold coated wire. Experiments were performed on gold plated copper wire. It was found, however, that when the ball was formed, it was necessary that there be at least 50% gold in the resulting ball structure for an effective joint to be formed. If there was less than 50% gold, the compression bonding was not effective and good bonds were not obtained. It was found, therefore, that in the case of gold plated copper wire, the thickness of the plating of the gold on the wire should be at least 50% of the total thickness of the wire. In addition, it was found that such a composition of the wire can withstand liquefaction of the lead/tin eutectic which is greater than 180° centigrade. In the case of gold clad wire, complete lead/tin reflow around the wire and ball leave the wire intact and thus an interconnection is achieved.

Although the invention has been described in some degree of particularity, various adaptions and modifications can be made without departing from the scope of the invention as defined in the appended claims.

What is claimed is:

1. A method of bonding gold or gold alloy wire to lead/tin solder overlying an underlying surface, comprising the steps of:
    forming said wire with an end portion having a composition of at least 50% gold, maintaining said solder at a temperature below the melting point of the lowest melting eutectic of said solder;
    and compression bonding said end portion of said wire to said solder, said bonding being characterized by said end portion of said wire being forced into said solder a distance sufficient to imbed a substantial portion of said end portion in said solder, but said end portion remaining out of contact with said underlying surface;
    whereby a gold/tin intermetallic compound is formed between at least part of said end portion of said wire and said solder.

2. The invention as defined in claim 1 wherein the wire is a gold wire.

3. The invention as defined in claim 1 wherein the wire is a gold clad copper wire, wherein the gold constitutes at least 50% by weight.

4. The invention as defined in claim 1 wherein the end portion of the wire is formed into a ball.

5. The invention as defined in claim 1 wherein the solder is approximately 95% lead and 5% tin.

6. The invention as defined in claim 1 wherein the bonding is ultrasonic bonding.

7. The invention as defined in claim 1 wherein the bonding is thermosonic bonding.

8. The invention as defined in claim 1 wherein the bonding is thermocompression bonding.

9. The invention as defined in claim 1 wherein said underlying surface is a pedestal on a semiconductor chip.

10. The invention as defined in claim 9 wherein the pedestal is comprised of Al/Cr/Cu/Au layers.

11. The invention as defined in claim 1 wherein said end portion of said wire is a ball formed of a copper/gold alloy.

12. The invention as defined in claim 1, 2, 3, 4, 5, 6, 7, 8, 9, 10, or 11 characterized by a further step, following said compression bonding, of heating said bonded wire and solder to a temperature below the melting point of the lowest melting eutectic of said solder.

* * * * *